United States Patent
Hascoat

(10) Patent No.: US 11,598,818 B2
(45) Date of Patent: Mar. 7, 2023

(54) DETERMINATION OF THE AGING OF AN ELECTRIC STORAGE SYSTEM

(71) Applicant: ELECTRICITE DE FRANCE, Paris (FR)

(72) Inventor: Aurelien Hascoat, Fontainebleau (FR)

(73) Assignee: ELECTRICITE DE FRANCE, Paris (FR)

(*) Notice: Subject to any disclaimer, the term of this patent is extended or adjusted under 35 U.S.C. 154(b) by 0 days.

(21) Appl. No.: 17/125,606

(22) Filed: Dec. 17, 2020

(65) Prior Publication Data
US 2021/0190880 A1 Jun. 24, 2021

(30) Foreign Application Priority Data
Dec. 18, 2019 (FR) ...................................... 19 14800

(51) Int. Cl.
| | |
|---|---|
| *G01R 31/392* | (2019.01) |
| *H02J 7/00* | (2006.01) |
| *H01M 10/42* | (2006.01) |
| *G01R 31/382* | (2019.01) |

(52) U.S. Cl.
CPC ......... *G01R 31/392* (2019.01); *G01R 31/382* (2019.01); *H01M 10/4285* (2013.01); *H02J 7/005* (2020.01)

(58) Field of Classification Search
CPC ..... G01R 31/392; G01R 31/382; H02J 7/005; H01M 10/4285; H01M 10/46; H01M 10/488
USPC ... 324/207.13–207.15, 200, 86, 167, 207.25, 324/425–434, 654, 76.75, 76.11, 500, 324/750.16, 220
See application file for complete search history.

(56) References Cited

U.S. PATENT DOCUMENTS

| | | | |
|---|---|---|---|
| 2005/0001625 A1 | 1/2005 | Ashtiani et al. | |
| 2013/0090900 A1* | 4/2013 | Gering | G01R 31/392 703/2 |
| 2017/0115358 A1 | 4/2017 | Kani et al. | |
| 2017/0299660 A1 | 10/2017 | Saint-Marcoux et al. | |

FOREIGN PATENT DOCUMENTS

| | | |
|---|---|---|
| DE | 10 2018 204 924 A1 | 10/2019 |
| EP | 1 450 173 A2 | 8/2004 |
| FR | 3 025 663 A1 | 3/2016 |

OTHER PUBLICATIONS

Search Report issued in related application FR 19 14800, dated Sep. 24, 2020, 2 pages.

* cited by examiner

*Primary Examiner* — Patrick Assouad
*Assistant Examiner* — Trung Q Nguyen
(74) *Attorney, Agent, or Firm* — Faegre Drinker Biddle & Reath LLP

(57) ABSTRACT

A method for determining an aging of a battery having a variable state of charge within a cycling window forming a portion of a nominal operating domain. The method comprises: getting a tracking of a state of charge of the battery as a function of time over an interval of time, where the tracking comprises an alternation of calls for charging and discharging within the cycling window; for a plurality of calls over the time interval, getting a value of an electric measure indicative of energy exchanged by the battery during said call and estimating a state of health of the battery during said call based on said value; and determining an aging of the battery, on the basis of the estimated states of health.

11 Claims, 4 Drawing Sheets

DETERMINATION OF THE AGING OF AN ELECTRIC STORAGE SYSTEM

CROSS-REFERENCE TO RELATED APPLICATION

This application claims priority benefit under 35 U.S.C. § 119(d) from French Patent Application No. 19 14800, filed Dec. 18, 2019, the disclosure of which is incorporated by reference herein in its entirety.

FIELD

The disclosure relates to the field of electric storage systems.

More specifically, the disclosure covers methods for determining an aging of an electric storage system, computer programs intended to implement such methods, data storage devices storing such computer programs, and processing circuits comprising such data storage devices.

BACKGROUND

Just like any battery, the smallest element of an electric vehicle battery (or battery for any other use) is called a cell. The usual voltage of a lithium ion technology cell is commonly included between 2.5 V and 3.4 V, where the average for discharge is located around 3 V. This measure is related to the power (expressed in watts) at which the energy can be restored. The greater the power extracted from the cell, the more the value of the average cell voltage drops. The electric capacity is also an essential measure. This measure is expressed in A·h (ampere-hour); it is the quantity of current which can be extracted per unit time. The quantity of energy (measured in Wh, watts-hour) is the product of the capacity and the voltage restorable during a complete or partial discharge and therefore it intrinsically conditions the independent operating time of a battery system like for example the operating time of an electric vehicle (EV).

Considering the field of the electric vehicle, several hundred of these cells are assembled in a complex manner (pack) in order to provide the electric motor sufficient power for moving the vehicle (assembly in series) and for guaranteeing the EV an acceptable operating time (assembly in parallel).

The performance of electrochemical energy storage systems shrinks naturally over the course of their use (called cycle-related aging) or even separate from their use (called calendar aging). For the EV, aging depends for example on the cells used, the usage of the EV, the climate, the place of garaging and even the color of the vehicle which has an influence on the temperature thereof.

This established fact led to defining a variable called "State of Health" or SOH. Unitless, it is defined as the ratio between the real electric energy and the nominal electric energy.

Thus for a new system, the real electric energy is the same as the nominal energy. The SOH is 100%. For the EV, this progressive loss has the consequence of a progressive and uncontrollable loss of operating time (moderately predictable). When the operating time becomes unacceptable for the driver (SOH of 75% for the Renault Zoe), a new battery is installed on board the vehicle and the former battery is sent to be recycled in different forms (dismantling, recovery of parts, burning and recovery of metals).

A step of the recycling, which can be advantageous, is to consider a reuse of these systems in fields for which this performance drop is not prohibitive; a second life onboard EV falling behind in operating time or stationary storage toward electric grid applications in order to form, for example, a combination with intermittent, unpredictable photovoltaic production.

Such a second life is economically attractive both compared to the market price for new at the time of the purchase and throughout the second life. This reuse also comes under the European Union objective of building a circular economy.

The use of such systems is only conceivable if the safety, performance and lifetimes are satisfactory and sufficiently predictable. The SOH measurement of the battery is therefore a key element for getting a second use. The technical difficulty is to evaluate these criteria with used batteries having gone through stresses from unknown use over several years. To that is added a heterogeneity of these performances even at the level of the cells and inevitably a heterogeneity form one pack to another especially after different conditions of use.

We are specifically interested in the reuse of batteries from used electric vehicles. In practice, the companies which have the batteries either recycle them or sell them to third parties. But, they remain legally liable for these batteries, even after the sale to third parties and they remain so until the destruction or recycling. One way to get value from these used batteries consists of using them to produce new storage systems while maintaining their integrity (no dismantling of the elements of the battery once it is removed from the vehicle).

Determination of the state of health of a battery or of a cell is therefore a blocking point. Today there is only one measurement capable of determining this crucial property. This measurement consists of the complete discharge of the battery or the cell in order to measure the energy or the capacity thereof. Otherwise, predictive models of aging are used.

In the case of a reuse of second-life batteries in stationary systems, two practices are widespread.

The first practice consists of dismantling the packs in order to evaluate the quality of each cell. This case is possible when the company which initially has the batteries recycles them itself. These are characterized and then sorted according to a large number of parameters. This solution takes a lot of time, means for characterization and requires doing a new integration (electronics, welds, cases, etc.). It is then possible to make homogeneous reassemblies of cells having acceptable quality levels.

The other practice consists of producing second-life batteries from used packs either without having any idea of the state of health of the packs or by having an estimate drawn from models designed uniquely for approximating the state of health during onboard use in EV. In the context of a transfer of these batteries to a third-party company, it is hard to conceive of the transfer of data and models for obvious reasons of industrial secrecy. Further predictive models from the VE maker would not correspond to the new-life conditions of batteries in stationary use. For these systems kept intact, it is further impossible to do a full discharge of the system, even exceptionally. This possibility is prohibited by the management system of the battery for purposes of optimization of the lifespan during use in any EV. In fact manufacturers of electric vehicles have generally limited the charge window between a low state and a high state (for example between 20% in 80%), in order to be assured of a longer lifespan for the batteries. Thus it is impossible to fully discharge the batteries.

Since the new conditions of use can be very different from those encountered during an EV type use in terms of temperature, electrical current and cycling window, the aging prediction for this system is even more complex and represents a problem because it makes any attempt at large-scale second-life use risky.

There is therefore a need to quickly, simply and reliably evaluate the aging of an electric storage system formed from one or more batteries, without reference to a previous life of the battery or batteries.

SUMMARY

The present disclosure aims to improve the situation.

One aspect of the disclosure covers a method for determining an aging of at least one battery used in an electric storage system and having a variable state of charge within a cycling window forming a portion of a nominal operating domain, where the method comprises, for the or each battery:
- getting, from at least one moment of use of the battery, a tracking of a state of charge of the battery as a function of time over an interval of time starting at said moment, where the tracking comprises an alternation of calls for charging and discharging within the cycling window;
- for a plurality of calls over the time interval, getting a value of an electric measure indicative of energy exchanged by the battery during said call and estimating a state of health of the battery during said call based on said value; and
- determining an aging of the battery, on the basis of the estimated states of health.

Another aspect of the disclosure covers a computer program comprising instructions for implementing the method described above when this program is executed by a processor.

Another aspect of the disclosure covers a computer-readable nonvolatile recording support on which is recorded a program for implementing the method described above when this program is executed by a processor.

Another aspect of the disclosure, as shown in FIG. 2, covers a processing circuit comprising a processor PROC (100) connected to a nonvolatile recording support MEM (200) described above. Such a processing circuit may for example comprise an interface for communication COM (300) with a control device for the electric storage system.

By means of tracking the state of charge the battery which is read starting from the moment of use, for example during usual operation of the second-life battery, it is possible to evaluate the development of the state of health thereof over time.

On the basis of this evaluation, it is possible to determine the aging of a battery used in an electric storage system without knowledge of any previous use of the battery prior the moment of use and to establishing tracking of the state of charge.

Because of the possibility of implementing the method from the disclosure during the new use of the batteries, it is not necessary to characterize these batteries, or the cells which make them up, after their first life and before committing them to this new use.

The time savings resulting from the determination of the aging of the battery during use makes it easier to reuse on large-scale used batteries designed for example for electric vehicles. In particular, the reuse in stationary electric storage systems is made easier.

In an embodiment, the battery was previously used mounted in an electric vehicle.

Such batteries cannot be fully charged or discharged because of the limitations imposed during the design thereof. Hence, as previously indicated, the state of health of the battery is determined by reference on the basis of tracking a full charge or discharge thereof. Because of the tracking of the state of charge of the battery comprising an alternation of calls for charging and discharging, it is possible to determine the aging of the battery including if it was previously used mounted an electric vehicle, therefore even if it cannot be completely charged or discharged.

In an embodiment, estimating the states of health comprises:
- identifying, in the resulting tracking, a plurality of calls corresponding to a single call-type profile; and
- estimating the state of health of the battery for each identified call.

Thus, the estimates of the state of health of the batteries are reproducible and directly comparable.

An electric storage system automatically charging during off-peak times serves to naturally get, over normal use of the system, calls for charging corresponding to a single type profile.

The calls for charging for an electric storage system preferably charging by means of energy collected by a solar panel can vary depending on the insolation. Calls corresponding to a type profile can be caused repeatedly or periodically as needed in order to guarantee a repeated or periodic estimate of the state of health of the battery.

In an embodiment, the time interval is included between one month and one year.

With a one-month interval, there can be a sufficiently large number of estimates of state of health of the battery in order to determine the aging of the battery, with acceptable statistical precision.

However, such a determination requires either:
- abstracting the variability of external parameters affecting the aging of the battery such as seasonal temperature variations, or
- introducing a correction of the estimation of the aging depending on these external parameters which can for example be read separately or predicted.

A one-year interval is ideal for estimating the aging of a battery considering the variability of these external conditions.

In an embodiment, the alternation of a call for charging and a call for discharging forms a cycle:
- each state of health estimated during a call is associated with a number of cycles done, during the time interval, before said call; and
- determining, on the basis of the estimated states of health, an aging of the battery comprises determining an indication of a number of cycles done by the battery previous to the time interval.

Thus, it is possible to determine the number of cycles the battery has undergone since the first use thereof. On the basis of this number of charges, it is possible to predict for example a remaining lifespan of the battery in terms of remaining time and/or remaining number of cycles. With this prediction, the user can, for example, order a new replacement battery in advance.

In this embodiment:
- each state of health estimated during a call is associated with a date of said call, and on the basis of the estimated state of health, determining an aging of the battery comprises determining an indication of the calendar aging of the battery.

Determining the aging of the battery may for example be used in various ways.

In an embodiment, the method further comprises:

anticipating the progression of the state of health of the battery on the basis of the determined aging.

Estimating the aging of the battery in fact serves to predict the tempo of the subsequent degradation of the state of health of the battery.

The degree of certainty of the prediction is particularly high when both the calendar aging and the cycle-related aging are determined.

In fact, the calendar aging and the cycle-related aging influence the subsequent degradation of the state of health of the battery at different tempos.

This prediction can for example be done using for example a predictive model, by extrapolation of the currently estimated state of health of the battery and considering the determined aging.

In an embodiment, the method further comprises:

modifying an operating parameter of the battery on the basis of the determined aging.

For example, choosing an operating mode of the energy storage system from several possible operating modes can be planned on the basis of the aging of the battery or a prediction of a later state of health of the battery.

In fact if the predicted remaining lifespan of the battery is sufficiently large or if the aging of the battery is below some threshold, increasing the difference between the upper state of charge limit and the lower state of charge limit, which forms the cycling window, can be planned.

Increasing the size of the cycling window has the effect of maximizing the operating time of the battery. In that way, the battery is used so as to provide optimal performance.

If instead the predicted remaining lifespan of the battery is less than a preset threshold or if the aging of the battery is beyond a preset threshold, reducing the difference between the upper state of charge limit and the lower state of charge limit, which forms the cycling window, can be planned.

Reducing the size of the cycling window has the effect of prolonging the remaining lifespan of the battery compared to the predicted value. Thus, when the battery is at end of life, operation thereof may correspond to an operating mode with which to delay replacement thereof.

In an embodiment, the method further comprises:

determining a need to replace the battery on the basis of the determined aging.

In fact, the aging of the battery or the prediction of the state of health of the battery can be used for estimating a remaining interval before replacement of the battery or a number of remaining cycles before replacement of the battery. Such estimates can give rise to an alert intended for the user or the supplier of the storage system and can for example give rise to an order, possibly automatic, for a replacement battery.

BRIEF DESCRIPTION OF THE DRAWINGS

Other characteristics, details and advantages will appear upon reading the following detailed description and upon analysis of the attached drawings, in which.

DETAILED DESCRIPTION

An electric storage system comprising one or more batteries is considered. Each battery is an electric storage element. Here battery can designate any kind of electrochemical storage battery. The most widespread kind of electrochemical storage battery is lithium ion type. Various lithium-ion chemistries such as NMC, LMO, and LFP can be considered, as can electrochemical storage batteries without lithium ions such as solid electrolyte batteries.

Figure 1:
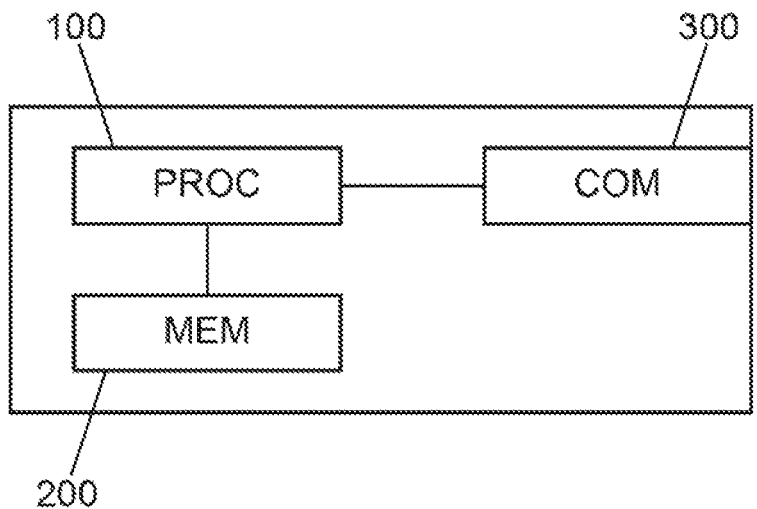
FIG. 1 shows schematically the structure of a processing circuit, in a sample implementation for practicing the proposed method.
Figure 2:
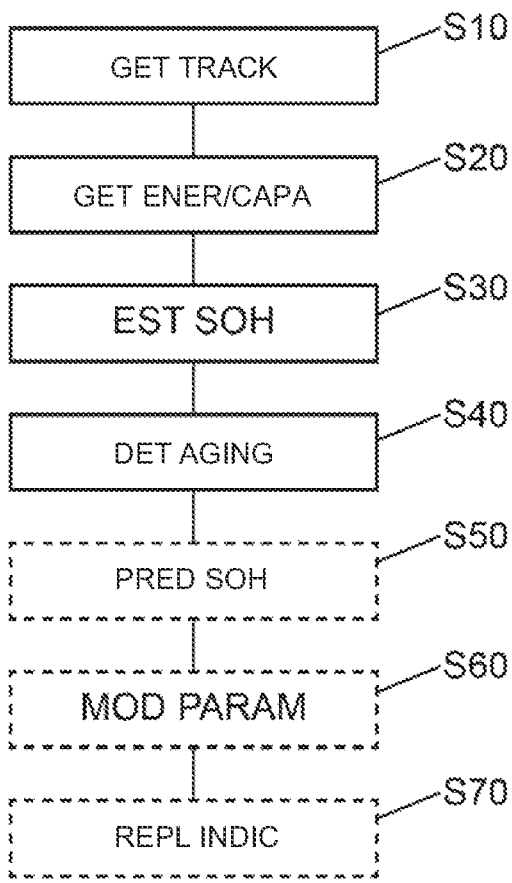
FIG. 2 is a sequence diagram of a general algorithm for computer program, in a sample implementation for practicing the proposed method.

Now referring to FIG. 2, which shows a sample general algorithm for a computer program for implementing a sample embodiment of the proposed method.

The proposed embodiment serves to determine and protect the state of health of a second-life stationary storage system made up of one or more batteries from electric vehicles (batteries not dismantled for reuse) while getting free from data and models acquired and used during the first life.

Operating data tracking from the energy storage system is obtained GET TRACK (S10) during partial cycles.

An example of partial cycling is a discharge or charge in a cycling window delimited by a maximum charge state boundary (for example 80%) and the minimum charge state boundary (for example 20%).

The charge or discharge profile can be defined in advance or can respond to an operating need. For a time representative of the new use and the aging (from several months to one year), the energy storage system operates normally, which is by regularly introducing a call-type profile (monotonic charge or discharge between minimum and maximum boundaries, if possible at constant current and similar temperature conditions).

Operating data comprises a state of charge of the battery as a function of time and may comprise a variation of other electric measures as a function of time characterizing an electric energy transfer from or to the energy storage system, or more specifically from or to a battery of the energy storage system.

Such an electric measure can be an electric voltage, electric current, electric power, impedance, etc.

In order to get good precision, the acquisition time can vary. For example, in order to store solar energy in continental France, it is preferable to do the acquisition over one full year in order to integrate the effects related to the passage of the seasons. Otherwise, choose an acquisition period during the spring or fall. Other dispositions can be taken according to the geographic location and the climate.

Figure 3:
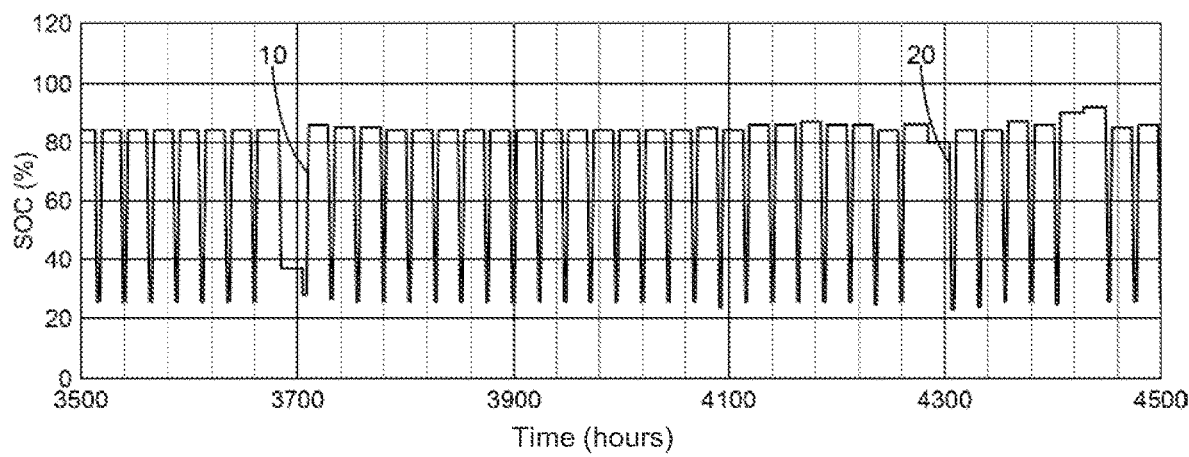
FIG. 3 is an example of tracking the state of charge of a battery over a 1000-hour interval between 3500 and 4500 operating hours.

An example of operating data tracking for such a battery is shown in FIG. 3 in the form of a state of charge as a function of time. The profile is very reproducible and follows from a stationary usage called "residential". The electric storage system charges during the day through the solar panels and then discharges according to demand. Each charge 10 is represented by an increase of the state of charge. Each discharge 20 is represented by a decrease of the state of charge.

Figure 4:
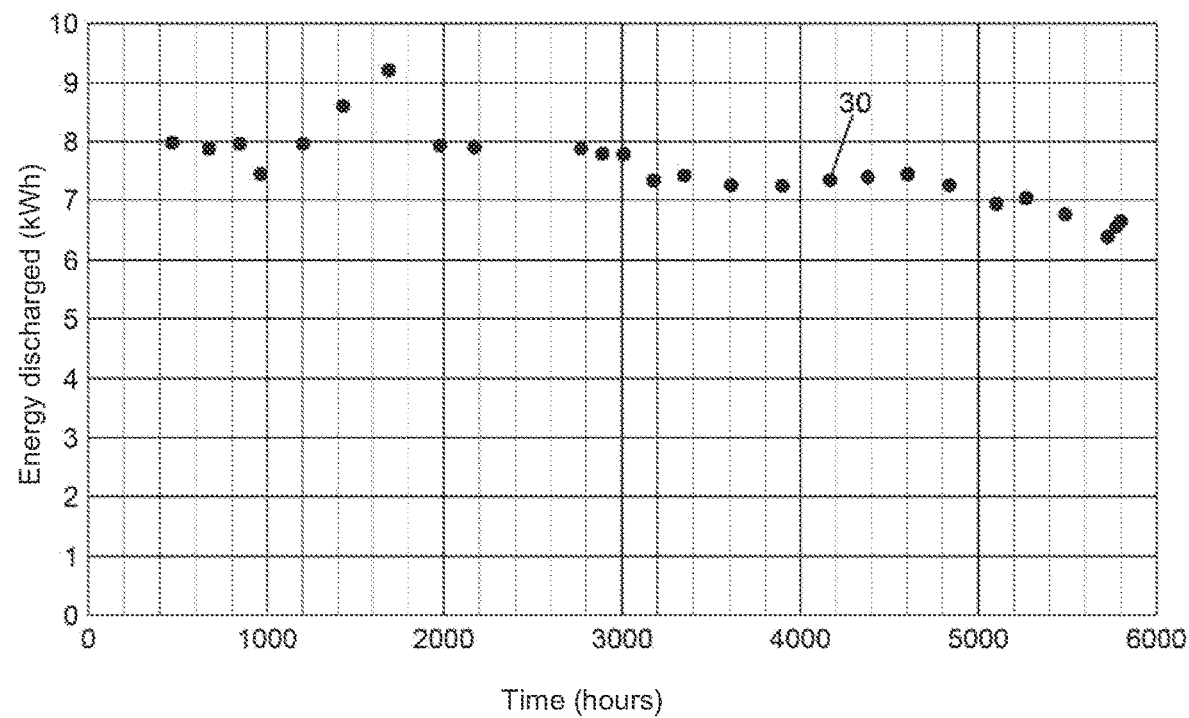
FIG. 4 shows an integration of the discharged power over each discharge for a plurality of discharges of a battery.

Now refer to FIG. 4 that shows an integration of the discharged power over each discharge for a plurality of discharges of a battery. This integration is done from the tracking of the state of charge obtained as a function of time shown in FIG. 3.

The integration of the power during these discharges (or charges) serves, for each call, to determine the energy 30 exchanged during said call. Alternatively, it is possible to integrate the current during each charge or discharge, which serves to determine the capacity exchanged for each cycle.

Generally, the energy capacity exchanged for each cycle GET ENER/CAPA (S20) can be obtained and this development can be tracked over the operating life by integrating the power or the current over one charge or one discharge.

All the electric energy contained in each battery is not used during each charge or partial discharge. However, even if the call is only partial, the entirety of the battery ages. The resulting energies and capacities can be corrected, for example by application of the law of proportionality, so as to express each partial cycle done as equivalent to a fraction of a complete cycle.

It can thus be considered for example that the energy E(exch i–j) exchanged during a cycle between a first charge state i and a second charge state j, where i and j are expressed as percentages, is proportional to |i–j| (the modulus of the difference between i and j).

By using the same law of proportionality as above, it is possible to calculate, from a capacity exchanged during a partial cycle between the first state of charge i and the second state of charge j, what would have been the capacity which would've been exchanged if the cycle were done between 100% and 0% state of charge.

The energy or the capacity exchanged during a given partial cycle between the first state of charge i and the second state of charge j is maximal when the state of health (SOH) of the battery is 100%.

Over time, the state of health of the battery decreases. By repeating an identical partial cycle over time, a loss of energy ($\Delta E$) and a loss of capacity ($\Delta C$) exchanged is observed.

For a plurality of partial cycles, on the basis of the energy or the capacity exchanged during the cycle, the state of health SOH 40 of the battery is estimated EST SOH (S30).

Figure 5:
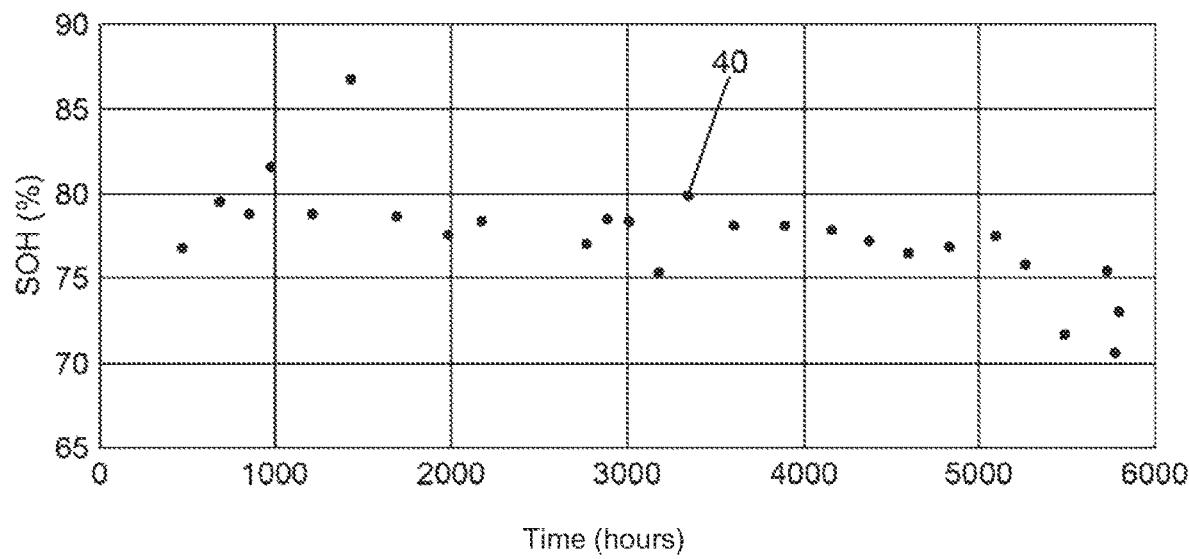
FIG. 5 shows an estimate of the progression of the state of health of the battery during operation thereof, according to an embodiment.

Now refer to FIG. 5 that shows state of health SOH 40 of the battery for a plurality of discharges of a battery. Here the state of health is determined based on the energy exchanged during each discharge.

The state of health SOH 40 can be obtained by dividing the energy (or the capacity) exchanged during a partial cycle by the energy (or capacity) which would have been exchanged during the same partial cycle by a battery having a 100% state of health.

Alternatively, the state of health SOH is obtained from the energy (or the capacity) exchange during a partial cycle:

by determining the energy (or the capacity) which would've been exchanged if the cycle had been complete, therefore done between 100% and 0% state of charge, and by dividing the energy (of the capacity) thus determined by the nominal energy (or the capacity) exchanged by a battery having a state of health of 100% during a cycle done between 100% and 0% state of charge.

The nominal energy and capacity are generally known and provided by the manufacturer of the battery.

The estimated state of health over time for a plurality of calls on the battery are stored and on the basis of the stored states of health, an aging of the battery is determined DET AGING (S40).

There are many models with which to describe and predict aging.

In the embodiment shown, the model used as a known fatigue-type model. This connects the calls endured by the batteries (temperature, current, state of charge) the damages caused by these calls which add up over the time of use.

This predictive aging model takes into consideration the new conditions of use of the second-life battery.

This model considers that the energy losses ($\Delta E$) related to calendar aging and cycle-related aging accumulate according to the expression $\Delta E = k_{cycle} \cdot t + k_{calendar}$. The equation for the module can be solved by linearization of the data by considering a straight line with the equation $\Delta E / \sqrt{t} = k_{cycle} \cdot \sqrt{t} + k_{calendar}$.

Figure 6:
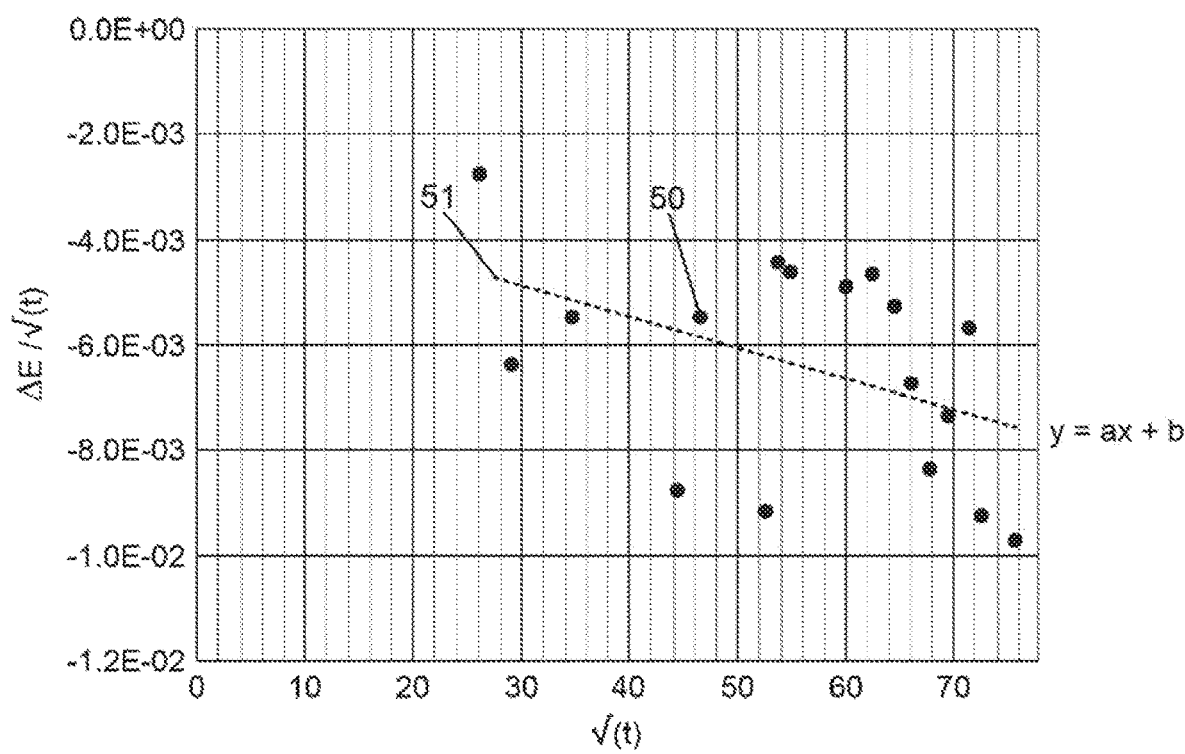
FIG. 6 shows the linearization, according to a predictive aging model in an embodiment, of the progression of the state of health of the battery during operation thereof shown in FIG. 5.

As FIG. 6 shows, the parameters are then deduced graphically by a graphical representation 51 of $\Delta E / \sqrt{t}$ as a function of t, superposed on the calculated values 50 from $\Delta E / \sqrt{t}$ where:

a is the value of the slope, equal to $k_{cycle}$; and b is the value of the ordinate at the origin, equal to $k_{calendar}$.

Thus, the model serves to decouple the influence of the cycle-related aging and the calendar aging on the state of health of the battery.

Starting from the determined aging, it is possible to predict PRED SOH (S50) the progression of the state of health of the battery.

Figure 7:
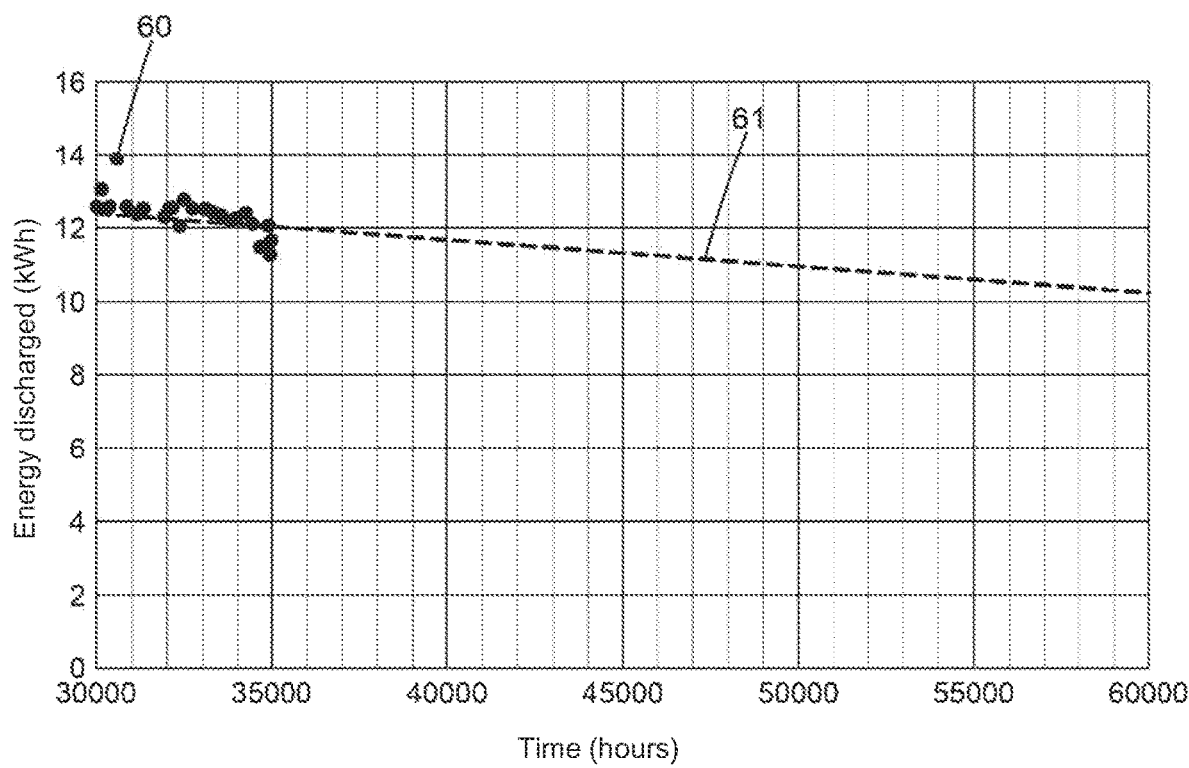
FIG. 7 shows a predictive modeling of degradation of an electric storage system in an embodiment and the comparison of this predictive modeling with estimated states of health.

In FIG. 7, the predictions 61 of development of the state of health of a battery as a function of the time over a 30,000-hour interval are shown dotted, superposed with state of health measurements 60 of the battery over an interval of 5000 hours.

Thus, by relying on the services rendered by an electric storage system comprising one or more batteries, it is possible to track and predict the development of the state of health of the storage system without knowing the history of the first life of the batteries.

By having both an indication of the cycle-related aging and an indication of the calendar aging, the development of the state of health of the battery as a function of the calendar aging and the cycle-related aging of the respective parts can be predicted with better precision both during the earlier use(s) of the battery and also during the planned subsequent use thereof.

Based on the predicted development of the state of health of the battery, it is then possible to redefine MOD PARAM (S60) the operating parameters for optimizing the services rendered by the battery and also the lifespan thereof, for example depending on the guarantee attached to the system.

It is also possible to predict the necessary system maintenance and in particular to indicate REPL INDIC (S70) that replacement of the battery is necessary. Being able to provide such an indication is a driver for the commercial development of a second-life reuse of electric vehicle batteries.

The invention claimed is:

1. A method for determining an aging of a second-life battery used in an electric storage system and having a variable state of charge within a cycling window forming a portion of a nominal operating domain, where the method comprises, for the second-life battery:

getting, from one moment of use of the second-life battery in its second life, a tracking of a state of charge of the second-life battery as a function of time over an interval of time starting at said moment, where the tracking comprises an alternation of calls for charging and discharging within the cycling window;

for a plurality of calls over the interval of time, getting a value of an electric measure indicative of energy exchanged by the second-life battery during said call and estimating a state of health of the second-life battery during said call based on said value; and determining an aging of the second-life battery, said aging being incurred by a previous use of the second-life battery prior to said moment of use, said aging being determined on the basis of the estimated states of health without using any data or model pertaining to said previous use of the second-life battery prior to said moment of use.

2. The method according to claim 1 where, the alternation of a call for charging and a call for discharging forms a cycle:

each state of health estimated during a call is associated with a number of cycles done, during the interval of time, before said call; and determining, on the basis of the estimated states of health, an aging of the second-life battery comprises determining an indication of a number of cycles done by the second-life battery previous to the interval of time.

3. The method according to claim 1, wherein:

each state of health estimated during a call is associated with a date of said call, and on the basis of the estimated state of health, determining an aging of the second-life battery comprises determining an indication of the calendar aging of the second-life battery.

4. The method according to claim 1, wherein, the second-life battery was previously used mounted in an electric vehicle.

5. The method according to claim 1, comprising:

anticipating the progression of the state of health of the second-life battery on the basis of the determined aging.

6. The method according to claim 1, comprising:

modifying an operating parameter of the second-life battery on the basis of the determined aging.

7. The method according to claim 1, comprising:

determining a need to replace the second-life battery on the basis of the determined aging.

8. The method according to claim 1, wherein the interval of time is included between one month and one year.

9. The method according to claim 1, wherein estimating the states of health comprises:

identifying, in the resulting tracking, a plurality of calls corresponding to a single call-type profile; and estimating the state of health of the second-life battery for each identified call.

10. A computer-readable nonvolatile recording support on which is recorded a program for implementing the method of claim 1 when this program is executed by a processor.

11. A processing circuit comprising a processor connected to a nonvolatile recording support according to claim 10.

* * * * *